(12) United States Patent
Higashitani (10) Patent No.: US 7,994,565 B2
(45) Date of Patent: Aug. 9, 2011

(54) NON-VOLATILE STORAGE HAVING A CONNECTED SOURCE AND WELL

(75) Inventor: Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 452 days.

(21) Appl. No.: 12/060,956

(22) Filed: Apr. 2, 2008

(65) Prior Publication Data
US 2009/0251967 A1    Oct. 8, 2009

(51) Int. Cl.
H01L 29/788    (2006.01)
H01L 29/792    (2006.01)

(52) U.S. Cl. ........... 257/316; 257/326; 257/E29.129; 365/185.13; 365/185.17

(58) Field of Classification Search .......... 257/316, 257/326, E29.129; 365/185.13, 185.17
See application file for complete search history.

(56) References Cited

U.S. PATENT DOCUMENTS

| | | | |
|---|---|---|---|
| 6,188,115 B1 | 2/2001 | Kamitani | |
| 6,967,874 B2 * | 11/2005 | Hosono | 365/185.33 |
| 7,397,701 B2 * | 7/2008 | Yeh et al. | 365/185.18 |
| 2006/0180850 A1 | 8/2006 | Brazzelli | |
| 2007/0141780 A1 | 6/2007 | Higashitani | |
| 2008/0036095 A1 | 2/2008 | Suzuki | |
| 2009/0080229 A1 * | 3/2009 | Chandra Sekar et al. | 365/63 |
| 2009/0109754 A1 * | 4/2009 | Schumann et al. | 365/185.11 |
| 2010/0277981 A1 * | 11/2010 | Aritome | 365/185.03 |
| 2010/0290289 A1 * | 11/2010 | Aritome | 365/185.19 |

FOREIGN PATENT DOCUMENTS

| | | |
|---|---|---|
| EP | 1349214 | 10/2003 |
| EP | 1437772 | 7/2004 |

OTHER PUBLICATIONS

International Search Report dated May 20, 2009, PCT Patent Appl. No. PCT/US2009/037049, filed Mar. 13, 2009.
Written Opinion of the International Searching Authority dated May 20, 2009, PCT Patent Appl. No. PCT/US2009/037049, filed Mar. 13, 2009.

* cited by examiner

Primary Examiner — Ngan Ngo
(74) Attorney, Agent, or Firm — Vierra Magen Marcus & DeNiro LLP (57) ABSTRACT

A non-volatile storage device is disclosed that includes a set of connected non-volatile storage elements formed on a well, a bit line contact positioned in the well, a source line contact positioned in the well, a bit line that is connected to the bit line contact, and a source line that is connected to the source line contact and the well.

21 Claims, 12 Drawing Sheets

NON-VOLATILE STORAGE HAVING A CONNECTED SOURCE AND WELL

BACKGROUND OF THE INVENTION

1. Field of the Invention

The present invention relates to technology for non-volatile storage.

2. Description of the Related Art

Non-volatile semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Figure 1:
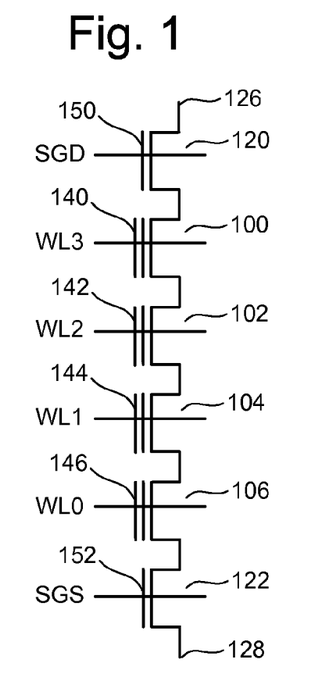
FIG. 1 depicts a NAND string.

One example of a flash memory system uses the NAND structure, which includes arranging multiple transistors connected in series between two select gates. The transistors in series and the select gates are referred to as a NAND string. FIG. 1 is a circuit diagram of one example of a NAND string. The NAND string depicted in FIG. 1 includes four transistors (or memory cells) 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line contact 128. Select gate 120 is controlled by applying the appropriate voltages to select line SGD. Select gate 122 is controlled by applying the appropriate voltages to select line SGS. The four transistors 100, 102, 104 and 106 are positioned in a common p-well. Each of the transistors 100, 102, 104 and 106 has a control gate and a floating gate that form a floating gate stack. The control gates are connected to word lines (e.g., WL0-WL3). In some embodiments, the word lines are the control gates.

Although FIG. 1 shows four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. Additionally, in some embodiments, types of charge storage layers other than floating gates can also be used. One example of a charge storage layer other than a floating gate is a charge trapping layer made from silicon nitride ("nitride"), or other suitable material.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Figure 2:
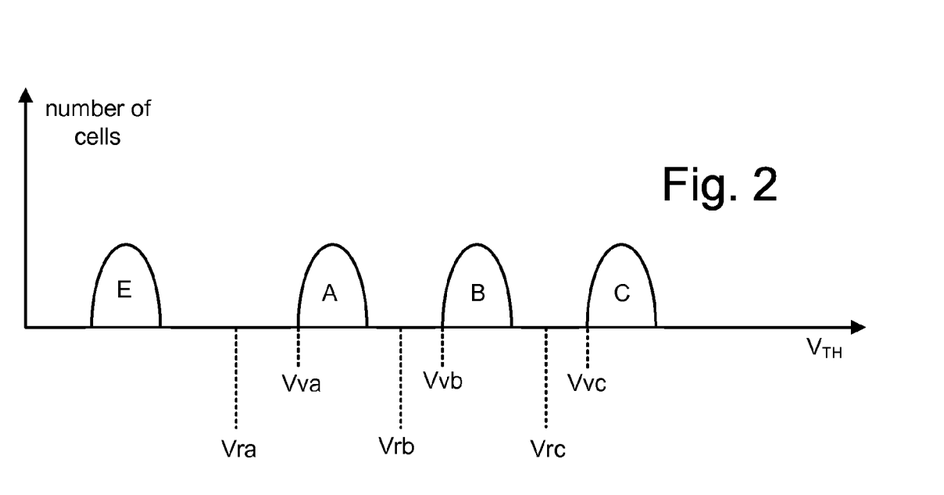
FIG. 2 is a graph of memory cells versus threshold voltage, and graphically depicts memory states for data stored in memory cells.

At the end of a successful programming process (with verification), the threshold voltages of the memory cells should be within one or more distributions of threshold voltages for programmed memory cells or within a distribution of threshold voltages for erased memory cells, as appropriate. FIG. 2 illustrates example threshold voltage distributions for the memory cell array when each memory cell stores two bits of data. Other embodiments, however, may use more or less than two bits of data per memory cell. A system that stores three bits of data in a memory cell would utilize eight threshold voltage distributions. FIG. 2 shows a first threshold voltage distribution E for erased memory cells. Three threshold voltage distributions A, B and C for programmed memory cells are also depicted.

Each distinct threshold voltage range of FIG. 2 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," describe various data encoding schemes for multi-state flash memory cells.

FIG. 2 shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 2 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In some embodiments, threshold voltage distribution E of FIG. 2 includes memory cells with negative threshold voltages and threshold voltage distributions A-C includes memory cells with positive threshold voltages. In other embodiments more than one threshold voltage distribution will include negative voltages. In those instances, it may become necessary to test for negative threshold voltage values. In some implementations, testing for negative threshold voltages requires a different voltage be applied to p-well for a NAND string than is applied when testing for a positive voltage or when programming.

The changing of the voltage applied to be p-well can, however, negatively impact performance because the p-well has a large area and, thus, a larger resistance. This larger resistance causes the new p-well voltage to be unstable for a period of time. As a result, the storage system must wait for the p-well voltage to stabilize before proceeding. This waiting reduces the performance of the storage system.

SUMMARY OF THE INVENTION

A non-volatile storage device is disclosed that includes a set of connected non-volatile storage elements formed on a well, a bit line contact positioned in the well, a source line contact positioned in the well, a bit line that is connected to the bit line contact, and a source line that is connected to the source line contact and the well. Because the p-well is connected to the source via local connections, changes to the p-well voltage stabilize faster. Another benefit is that space on the memory chip is saved because there is no space used for a separate connection to the well and there are no separate drivers for the well.

One embodiment includes a first set of non-volatile storage elements on a well, a first control line contact for the first set of non-volatile storage elements, a second control line contact for the first set of non-volatile storage elements, a first control line that connects to the first control line contact without connecting to the well, and a second control line that connects to the second control line contact and connects to the well.

One embodiment includes a set of connected non-volatile storage elements on a well, a bit line contact for the set of non-volatile storage elements, a source line contact for the set of non-volatile storage elements, a bit line that connects to the bit line contact without protruding into the well, and a source line that extends into the source line contact and extends into the well. The bit line contact is positioned in the well. The source line contact is positioned in the well.

One embodiment includes a set of non-volatile storage elements on a well, a bit line contact for the set of non-volatile storage elements, a source line contact for the set of non-volatile storage elements, a bit line that connects to the bit line contact and terminates at the bit line contact, and a source line. The source line connects to the source line contact, passes through the source line contact and protrudes into the well. The bit line contact is positioned in the well. The source line contact is positioned in the well.

One embodiment includes a non-volatile storage device having a plurality of NAND strings on a well. The NAND strings include bit line contacts. The non-volatile storage device also includes a plurality of bit lines that connect to the bit line contacts and do not connect to the well, and a source line that connects to all of the plurality of NAND strings and the well.

One embodiment for fabricating non-volatile storage includes forming a first set of non-volatile storage elements on a well, forming a first control line contact in the well for the first set of non-volatile storage elements, forming a second control line contact in the well for the first set of non-volatile storage elements, forming a first control line that connects to the first control line contact without protruding into the well, and intentionally forming a second control line that extends into the second control line contact and extends into the well.

One embodiment for fabricating non-volatile storage includes forming a plurality of NAND strings on a well. The NAND strings include bit line contacts. The process for fabricating non-volatile storage further includes forming a plurality of bit lines that connect to the NAND strings and terminate at the bit line contacts, and intentionally forming a source line that connects to all of the NAND strings and the well.

One embodiment for fabricating non-volatile storage includes forming a first dielectric layer on a well, forming a first gate layer on the first dielectric layer, forming a second dielectric layer on the first gate layer, forming a second gate layer on the second dielectric layer, creating source/drain regions in the well, forming bit line contacts in the well, forming source line contacts in the well, creating bit lines that connect to the bit line contacts and that do not connect to the well, and creating a source line that connect to the source line contacts and connects to the well.

DETAILED DESCRIPTION

Figure 3:
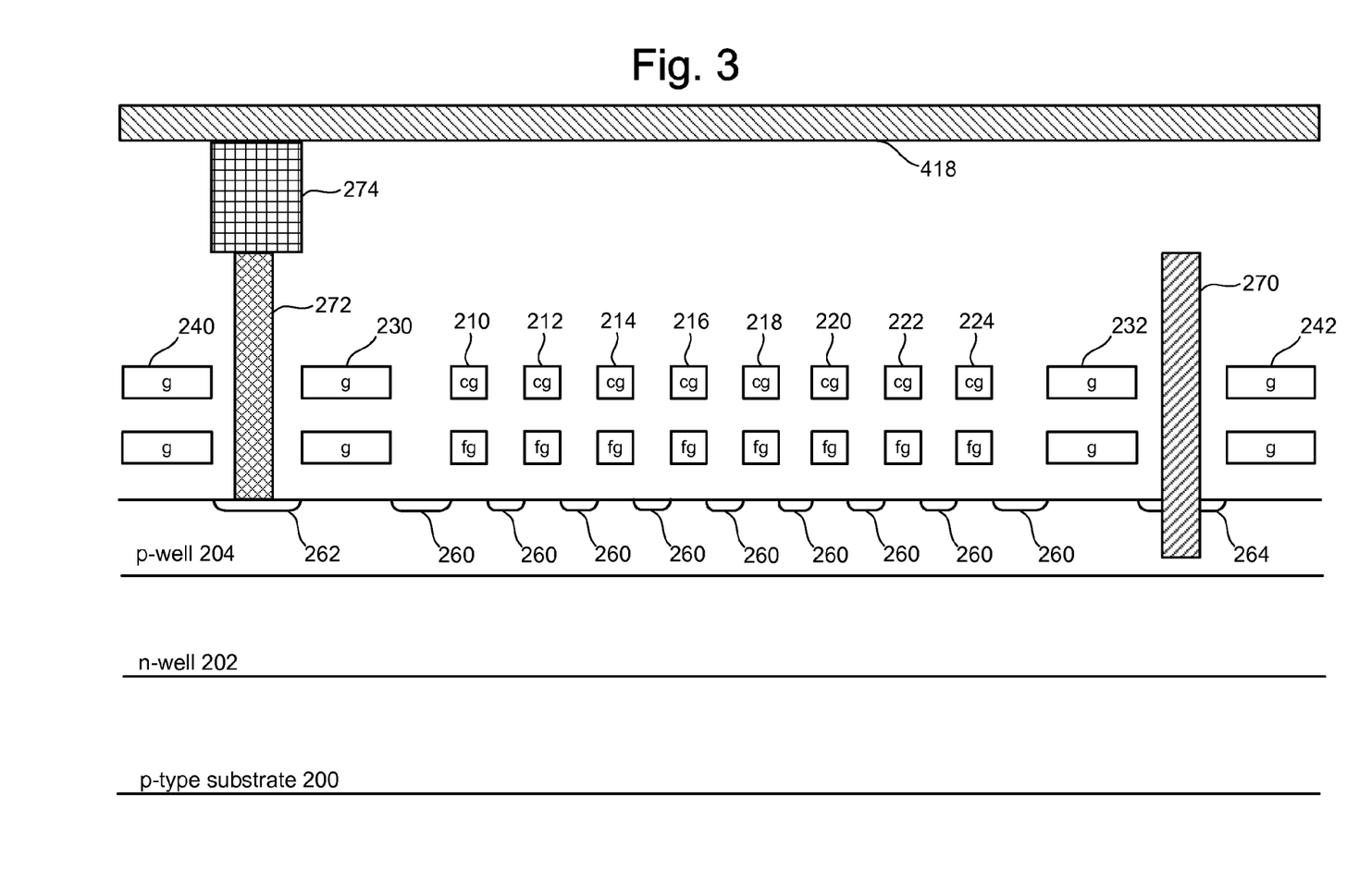
FIG. 3 is a side cutaway view of one embodiment of NAND flash memory.

FIG. 3 provides a cross-sectional view of one embodiment of a non-volatile storage device that implements the technology discussed herein. In one example, the non-volatile storage device is a NAND flash memory device. However, the technology described herein can be implemented with other types of non-volatile storage. FIG. 3 shows a p-type substrate 200. Within the p-type substrate 200 is an n-well 202. Within the n-well 202 is a p-well 204. Memory cells 210, 212, 214, 216, 218, 220, 222 and 224, which are positioned on p-well 204, comprise a NAND string. Each of the memory cells comprise a transistor that includes a floating gate (fg) and a control gate (cg). At one end of the NAND string is a drain side select gate 230 and on the other side of the NAND string is a source side select gate 232. The select gates are depicted in FIG. 3 as including two separate gates (g); however, when implemented these gates are shorted together to form one gate. FIG. 3 also shows a drain side select gate 240 for a neighboring NAND string and a source side select gate 242 for a different neighboring NAND string. Between the floating gates, and in p-well 204, are a set of source/drain regions 260. In one embodiment, the source/drain regions 260 are N+ diffusion regions.

In other embodiments, other polarities or geometries can be used. For example, a NAND string can be formed on an n-type substrate having a p-well in the n-type substrate, and an n-well in the p-well. In this embodiment, memory cells are formed on the n-well.

The NAND string of FIG. 3 includes a bit line contact 262 and a source line contact 264, both of which are positioned in p-well 204. In one embodiment, a bit line contact 262 and source line contact 264 are N+diffusion regions. FIG. 3 shows a source line 270 extending into source line contact 264 and extending into p-well 204 such that source line 270 passes through source line contact 264 and protrudes into p-well 204. In other embodiments, source line 270 can extend into the source line contact and p-well in a different manner. Because p-well 204 is connected to source line 270, changes to p-well voltages stabilize faster. Another benefit is that space on the memory chip is saved because there is no space needed for a separate connection to p-well 200 and there are no separate drivers for p-well 200. Thus, p-well 200 is biased by the source line, which is driven by the source line driver. In embodiments where the polarity of the substrate and wells are reversed, the source line can be connected to an n-well. FIG. 3 also shows a bit line 272 in contact with bit line contact 262; however, bit line 272 does not extend into bit line contact 262, does not extend into p-well 204, and does not connect to p-well 204. In one embodiment, bit line 272 terminates at the top surface of bit line contact 262.

In order to route signals, a memory chip that includes the NAND string of FIG. 3 will include multiple metal layers for implementing conductors for transmitting signals throughout the system. In one embodiment, source line 270 and bit line 272 are considered metal layer zero (M0). The next layer up is considered metal layer one (M1). FIG. 3 shows metal line 418 of metal layer M1 connected to bit line 272 via metal contact 274. The metal lines of M1 run parallel to the NAND string of FIG. 3.

Bit line 272 is in the shape of a column (round cross-section, square cross-section, or other shape). Source line 270 runs in and out of the page of FIG. 3 so that it connects to source line contacts for multiple NAND strings in the same block (see discussion below regarding FIG. 10) and connects to the p-well below and between the source line contacts for the different NAND strings.

Figure 4:
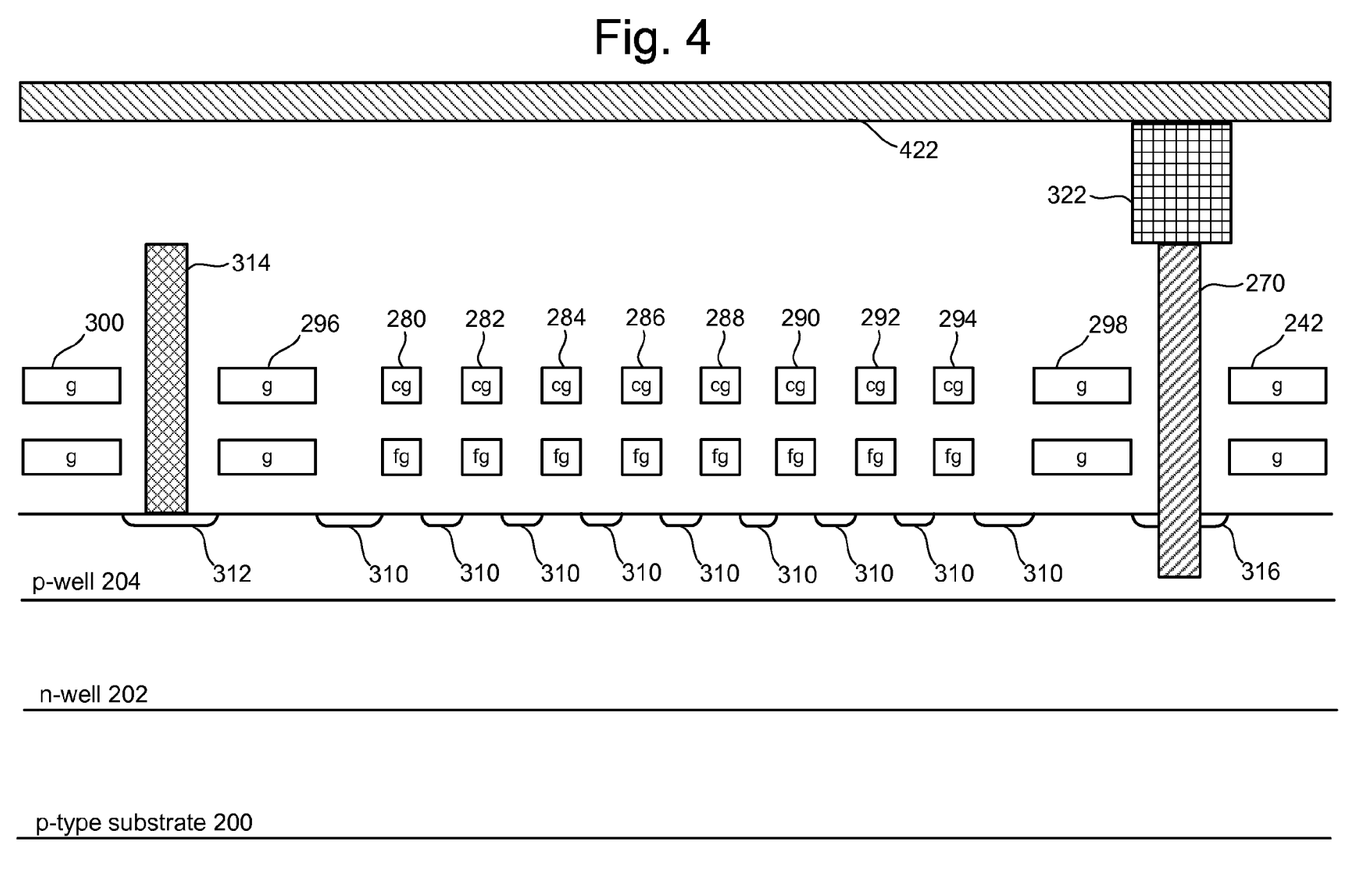
FIG. 4 is a side cutaway view of one embodiment of NAND flash memory.

FIG. 4 shows another NAND string, positioned on p-well 204, which includes memory cells 280, 282, 284, 286, 288, 290, 292 and 294. Each memory is a transistor that includes a floating gate (fg) and a control gate (cg). The NAND string of FIG. 4 also includes drain side select gate 296 and source side select gate 298. The NAND string includes source/drain regions 310 positioned in p-well 204 and between the floating gates, bit line contact 312 positioned in p-well 204, and source line contact 316 positioned in p-well 204. FIG. 4 also shows drain side select gate 300 of a neighboring NAND cell and source side select gate 302 of another neighboring NAND string. The NAND string of FIG. 4 is in the same block of NAND strings as the NAND string of FIG. 3 and, therefore, shares the same source line 270. As can be seen from FIG. 4, source line 270 extends into source line contact 316 and extends into p-well 204 such that it passes through source line contact and protrudes into p-well 204 to electrically connect source line 270 to both the source line contact 316 and p-well 204. Bit line 314 terminates at the top surface of bit line contact 312. The main difference between FIG. 4 and FIG. 3 is that bit line 314 is not connected to any M1 metal lines. Rather, FIG. 4 shows source line 270 connected to metal line 422 of metal layer M1 via metal contact 322.

Although the NAND strings of FIGS. 3 and 4 show eight memory cells in a NAND string, in some embodiments, more or less than eight memory cells can be used in a NAND string. In some embodiments, a NAND string could include sixty-four memory cells. Some NAND strings will also include one, two or more dummy memory cells which are not used to store data but can be used to otherwise control the conditions of a NAND string.

Figure 5:
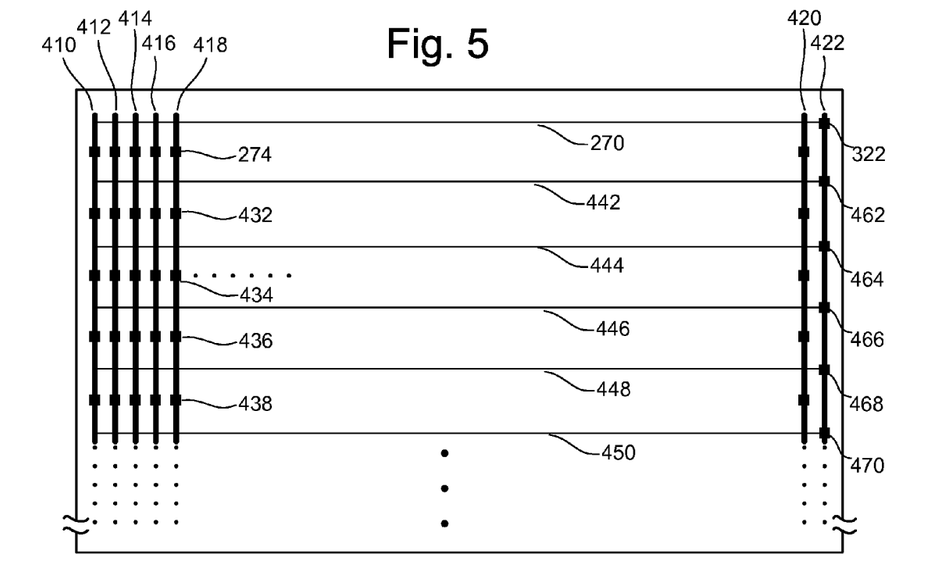
FIG. 5 is a top view of one embodiment of NAND flash memory.

FIG. 5 shows a top view of an example memory array that depicts a position of metal layers M0 and M1. Metal lines 410, 412, 414, 416, 418, . . . , 420, 422 are part of metal layer M1. Metal lines 412-420 connect to the various bit lines for the NAND strings. For example, metal line 418 includes connection 274, connection 432, connection 434, connection 436, connection 438, . . . , that each connect to bit lines. In one example, the NAND strings run parallel to and underneath the various metal lines 410-420.

FIG. 5 also shows a set of source lines 270, 442, 444, 446, 448, 450, . . . , which are part of metal layer M0. Each of these source lines runs across the entire block of NAND strings and connects to each NAND string in the block. In one embodiment, the last line 422 of metal layer M1 is a dummy line. The NAND strings below metal line 422 are not used to store data. Therefore, there is no need to connect the bit lines for those NAND strings to metal line 422. Instead, metal line 422 is connected to the source lines. For example, metal line 422 is connected to source line 270 via contact 322, metal line 422 is connected to source line 442 via contact 462, metal line 422 is connected to source line 444 via contact 464, metal line 422 is connected to source line 446 via contact 466, metal line 422 is connected to source line 448 via contact 468, metal line 422 is connected to source line 450 via contact 470, . . . . In some embodiments, there are additional one or more higher levels of metal lines that are connected to M1 and to drivers.

Figure 6:
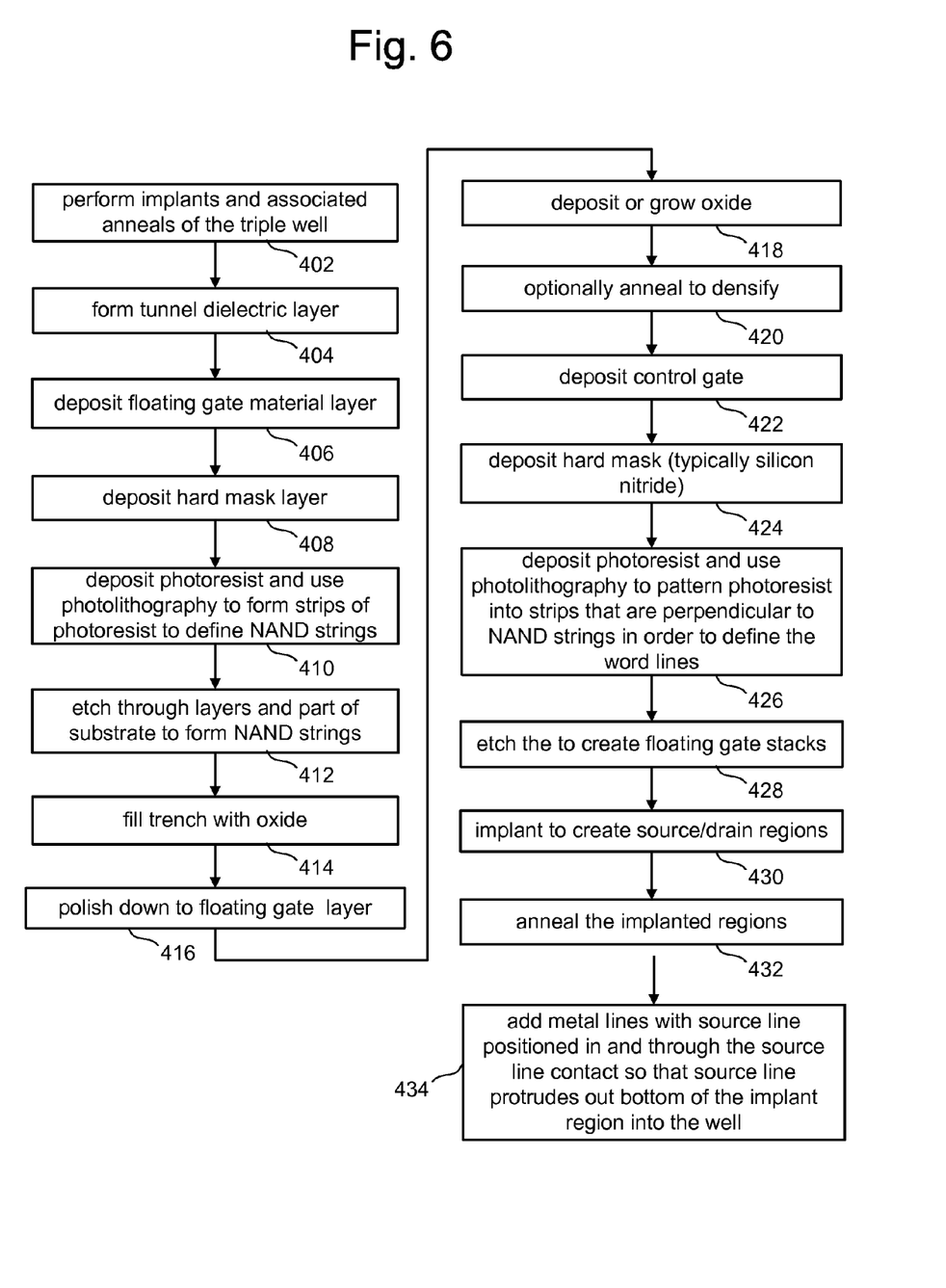
FIG. 6 is a flow chart describing a portion of one embodiment of a process for fabricating non-volatile storage.
Figure 7:
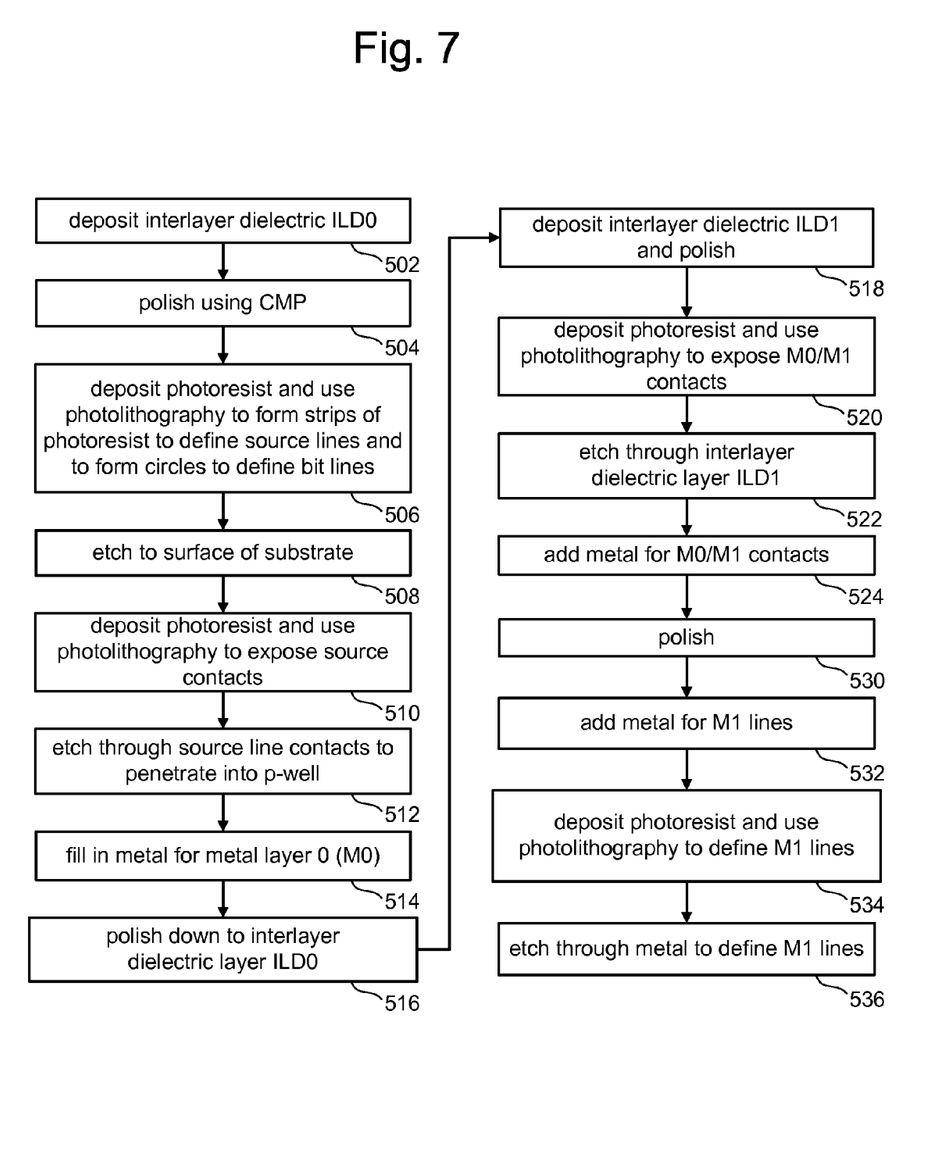
FIG. 7 is a flow chart describing a portion of one embodiment of a process for fabricating non-volatile storage.

FIGS. 6 and 7 are flow charts describing one embodiment of the front end of a process for manufacturing the non-volatile storage devices of FIGS. 3 and 4, which covers process steps only as far as forming some of the M1 metal layer. These flows do not cover all of the fabrication steps and one of ordinary skill in the art would understand the additional steps needed. There are many ways to manufacture memory according to the present invention and, thus, the it is contemplated that various methods other than that described by FIG. 6 and FIG. 7 can be used. While a flash memory chip will consist of both a peripheral circuitry, which includes a variety of low, medium, and high voltage transistors, and the core memory array, the process steps of FIGS. 6 and 7 are intended only to describe in general terms one possible process recipe for the fabrication of the core memory array. Many photolithography, etch, implant, diffusion and oxidation steps that are intended for the fabrication of the peripheral transistors are omitted.

Step 402 of FIG. 6 includes performing implants and associated anneals of the triple well. The result of step includes the p-substrate 200, n-well 222 within p-substrate 200, and p-well 204 within n-well 202. The sidewalls of the N-well that isolate the P-wells from one another are not depicted. The N-well depth is typically much thicker than that of the p-well. The p-substrate is usually the thickest consisting of the majority of the wafer thickness. In step 404, the tunnel dielectric layer is deposited on top of p-well 204. In one embodiment, the tunnel dielectric is made of $SiO_2$. In step 406, the floating gate is deposited over dielectric layer 30 using CVD, PVD, ALD or another suitable method. Step 408 of FIG. 6 includes depositing a hard mask using, for example, CVD, to deposit $SiO_2$ or $Si_3N_4$. In step 410, photolithography is used to form strips of photoresist over what will become the NAND strings. Step 412 includes etching through all layers, including part of the substrate. First, the hard mask is etched through using anisotropic plasma etching, (i.e. reactive ion etching with the proper balance between physical and chemical etching for each planar layer encountered). After the hard mask layer is etched into strips, the photoresist can be stripped away and the hard mask layer can be used as the mask for etching the underlying layers. The process, then includes etching through the floating gate material, the tunnel dielectric material and into the substrate to create trenches between the NAND strings, where the bottom of the trenches are inside the top p-well 204. In step 414, the trenches are filled with $SiO_2$ (or another suitable material) up to the top of the hard mask using CVD, rapid ALD or PSZ STI fill as described in "Void Free and Low Stress Shallow Trench Isolation Technology using P-SOG for sub 0.1 Device" by Jin-Hwa Heo, et. al. in 2002 Symposium on VLSI Technology Digest of Technical Papers, Session 14-1. PSZ STI fill is Polysilazane Shallow trench isolation fill In step 416 Chemical Mechanical Polishing (CMP), or another suitable process, is used to polish the material flat until reaching the floating gate poly-silicon. The floating gate is polished to 20 nm (10-100 nm in other embodiments). In step 418, the inter-poly tunnel dielectric is grown or deposited using ALD, CVD, PVD, Jet Vapor Deposition (JVD) or another suitable process. On examples of a material that can be used for the inter-poly tunnel dielectric includes (but are not limited to) $SiO_2$.

In step 420 of FIG. 6, which is an optional step, the inter-poly tunnel oxide is annealed to densify the oxide. In step 422, the one or more layers of the control gate are deposited on the inter-poly tunnel oxide. In one embodiment, the materials deposited during step 422 include poly-silicon, while in other embodiments this layer may be a metal layer. In some embodiments, the control gate is composed of the poly-silicon layer 36, tungsten-nitride layer 38, and tungsten layer 40, all of which are deposited in step 422.

On top of the control gate layer, a hard mask of $Si_3N_4$ is deposited using, for example, CVD in step 424. In step 426, photolithography is used to create patterns of perpendicular strips to the NAND string, in order to etch the multi-gate stack and form word lines (i.e. control gates) that are isolated from one another. In step 428, etching is performed using plasma etching, ion milling, ion etching that is purely physical etching, or another suitable process to etch the various layers and form the individual word lines.

In step 430, an implant process is performed to create the N+ source/drain diffusion regions, bit line contacts and source line contacts by Arsenic implantation. In one embodiment, a halo implant is also used. In step 432, an anneal process is performed. In step 434, metal lines are added. Step 434 includes adding the source line positioned in and through the source line contacts (which are N+ diffusion regions created above) so that the source line protrudes out of the bottom of the source line contacts and into the p-well.

FIG. 7 is a flow chart describing one embodiment of the process for adding portions of metal layer M0 and metal layer M1, including the source lines and bit lines. The process of FIG. 7 is one embodiment of a portion of step 434 of FIG. 6.

Figure 8A:
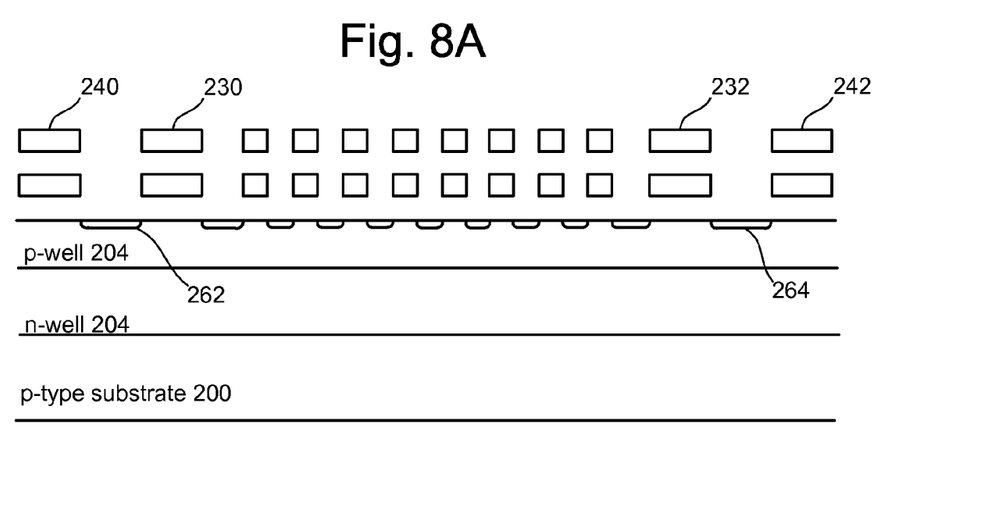
FIGS. 8A-H depict a non-volatile storage system during various steps of a manufacturing process.
Figure 8B:
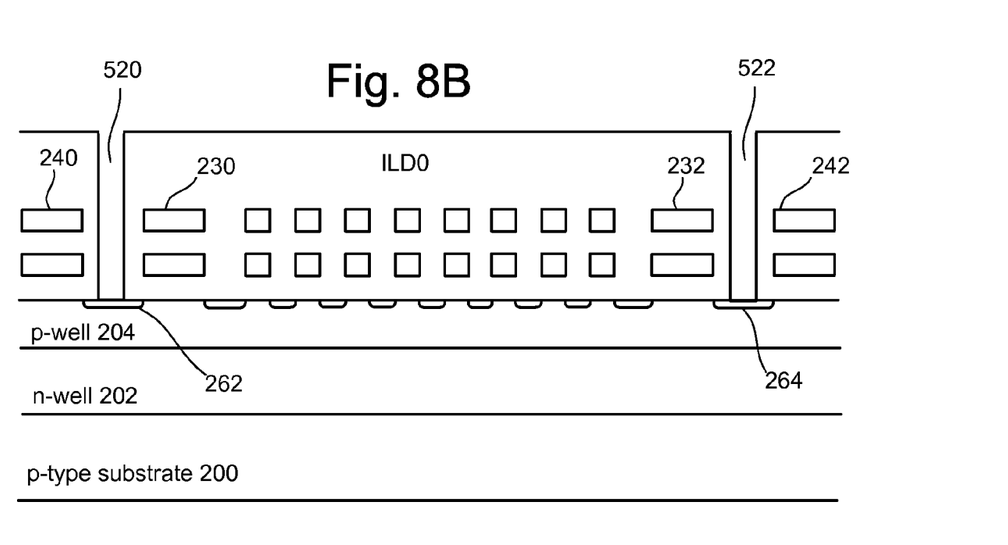
Figure 8C:
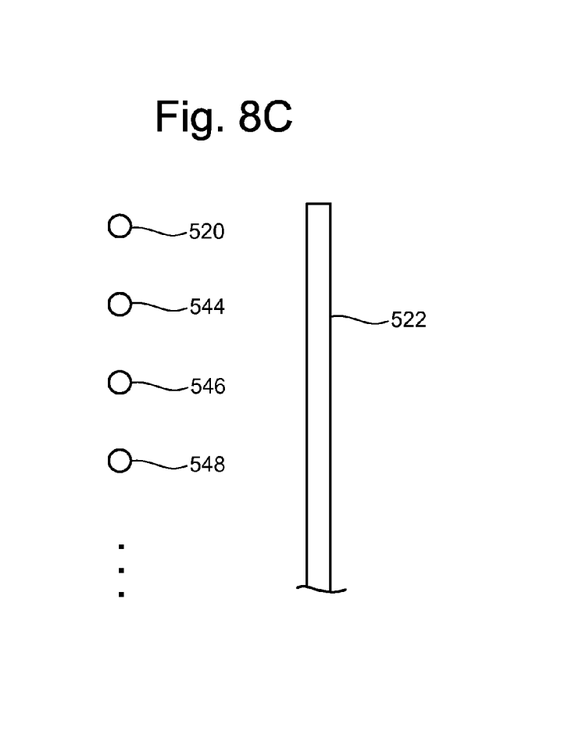

Prior to performing step 502 of FIG. 7, the non-volatile storage device being fabricated by the process of FIG. 6 will be in the condition depicted in FIG. 8A. In step 502, an interlayer dielectric ILD0 is deposited on the storage device. In one embodiment, the dielectric is $SiO_2$. However, other dielectrics can also be used. In step 504, the dielectric layer is polished using CMP. In step 506, photoresist is deposited and photolithography is used to form shapes of photoresist to define source lines and bit lines. In step 508, the interlayer dielectric ILD0 is etched down to the top surfaces of the bit line contacts and source line contacts in those places where the source lines and bit lines will be by using the masks from the photolithography. FIG. 8B shows a storage device being manufactured, after step 508. As can be seen, there is a trench 520 in the position where the bit line is to be located and a trench 522 where the source line is to be located. FIG. 8C is a top view of interlayer dielectric ILD0 showing the trench 522 for the source line and trenches 520, 544, 546 and 548 for various bit lines.

Figure 8D:
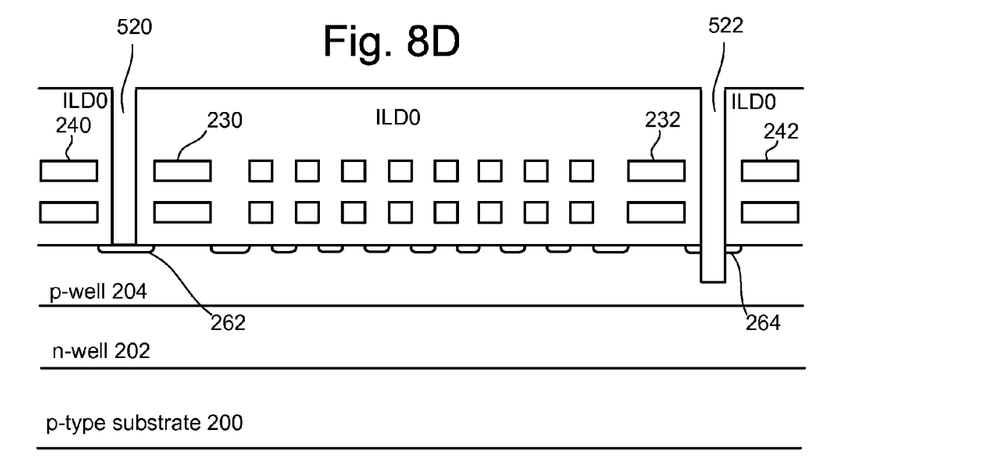

In step 510 of FIG. 7, photoresist is deposited and photolithography is used to expose only the source line contacts. In step 512, an etching process is performed to etch through the source line contact and penetrate into the p-well. FIG. 8D shows the storage device being manufactured, after step 512. In step 514, the masks are removed and metal is used to fill in metal layer M0. In one embodiment, metal layer M0 includes the bit lines and source lines. Therefore, step 514 includes filling in trenches 520, 522, 544, 546, 548, . . . , to create the bit lines and source lines. The metal added in step 514 includes, in one embodiment, three layers of metal. One implementation includes titanium, titanium nitride, and tungsten. The metal is added using CVD or sputtering. In step 516, the metal is polished using CMP so that the metal is flat with the top of interlayer dielectric ILD0.

Figure 8E:
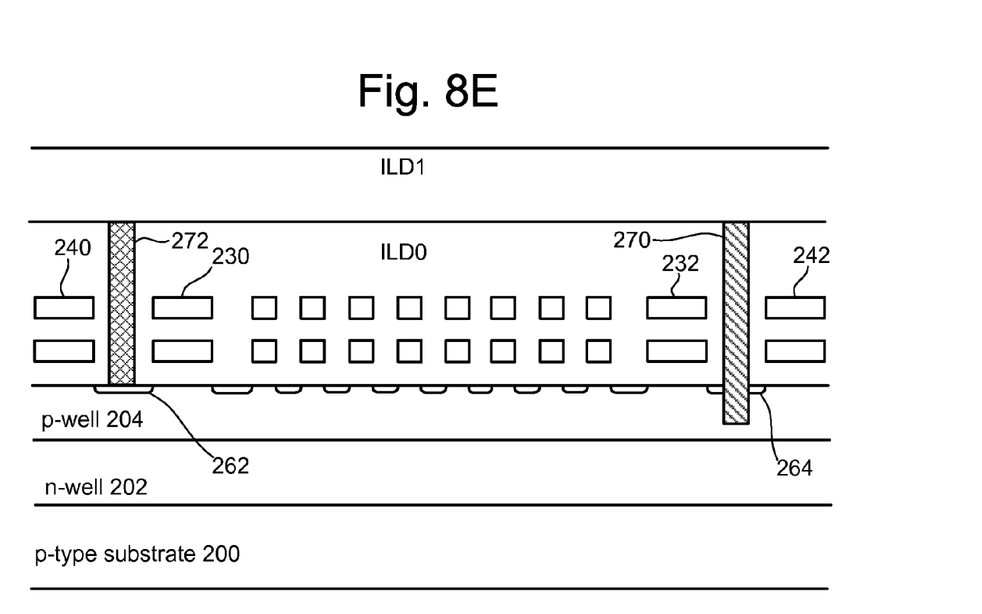
Figure 8F:
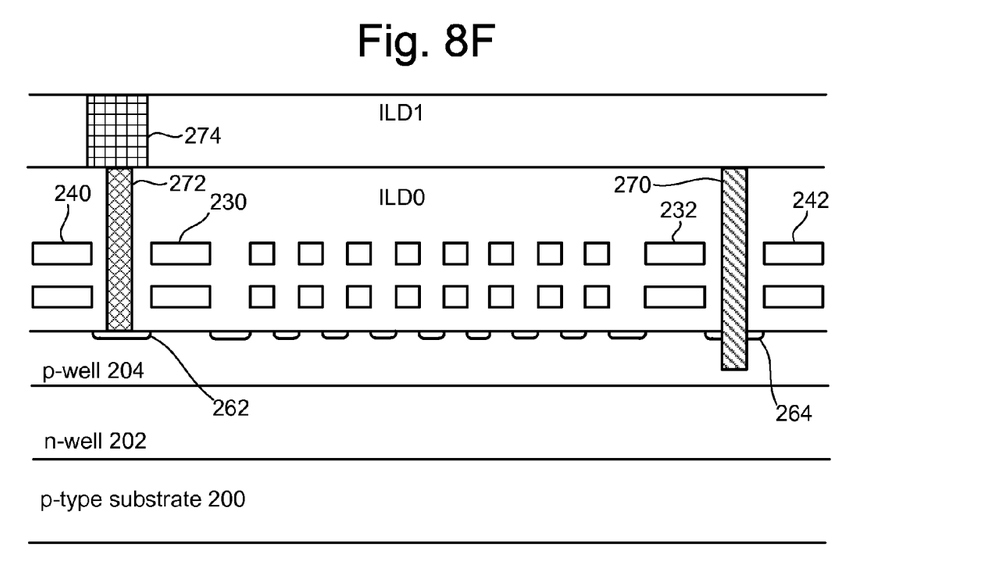

In step 518, another dielectric is deposited. This dielectric layer is referred to as interlayer dielectric ILD1. That additional dielectric is then polished using CMP so that it is flat. FIG. 8E shows the storage device being fabricated after step 518. In step 520, photoresist is deposited and photolithography is used to expose contact positions for contacts between metal layer M0 and M1. In step 522, a portion of interlayer dielectric ILD1 is etched through to define the contacts. In step 524, metal is added for the M0-M1 contacts. In step 530, the metal contacts are polished using CMP. FIG. 8F depicts the storage device being manufactured after step 530. The view of FIG. 8F shows the bit line connected to M2. Step 524 would also include adding the metal for the contacts between M1 and the source lines (e.g. contacts 322, 462, 464, 468, 470, . . . ).

Figure 8G:
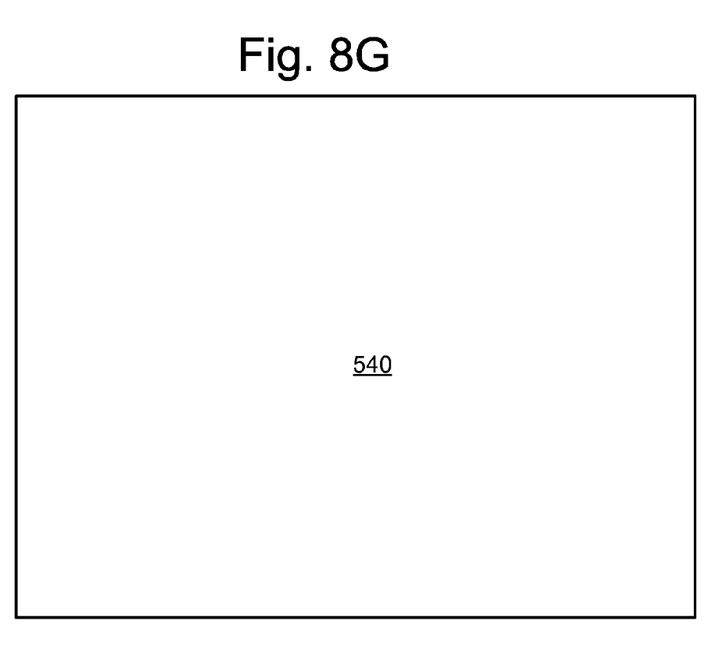
Figure 8H:
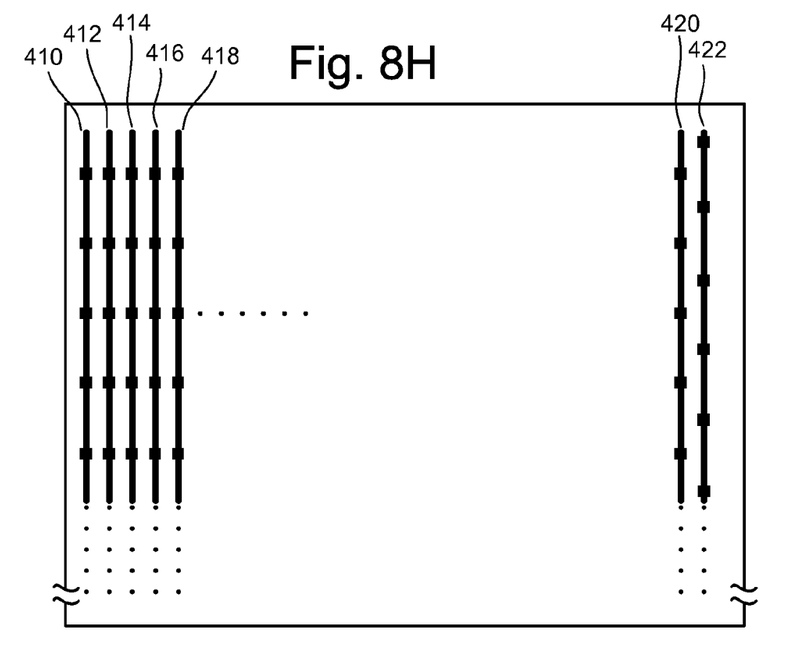

In step 532, a metal layer is deposited. This metal layer will eventually define the M1 metal lines. In one embodiment, the metal is tungsten, aluminum or copper, and is added using a Damascene process. FIG. 8G is a top view looking down in the memory array after step 532 and depicts the metal layer 540. In step 534, photoresist is deposited and photolithography is used to define the metal lines of metal layer M1. In step 536, an etching process is used to etch the metal 540 to define the metal lines of metal layer M1. FIG. 8H is a top view of metal layer M1 (and M1/M0 contacts) after step 536.

Figure 9:
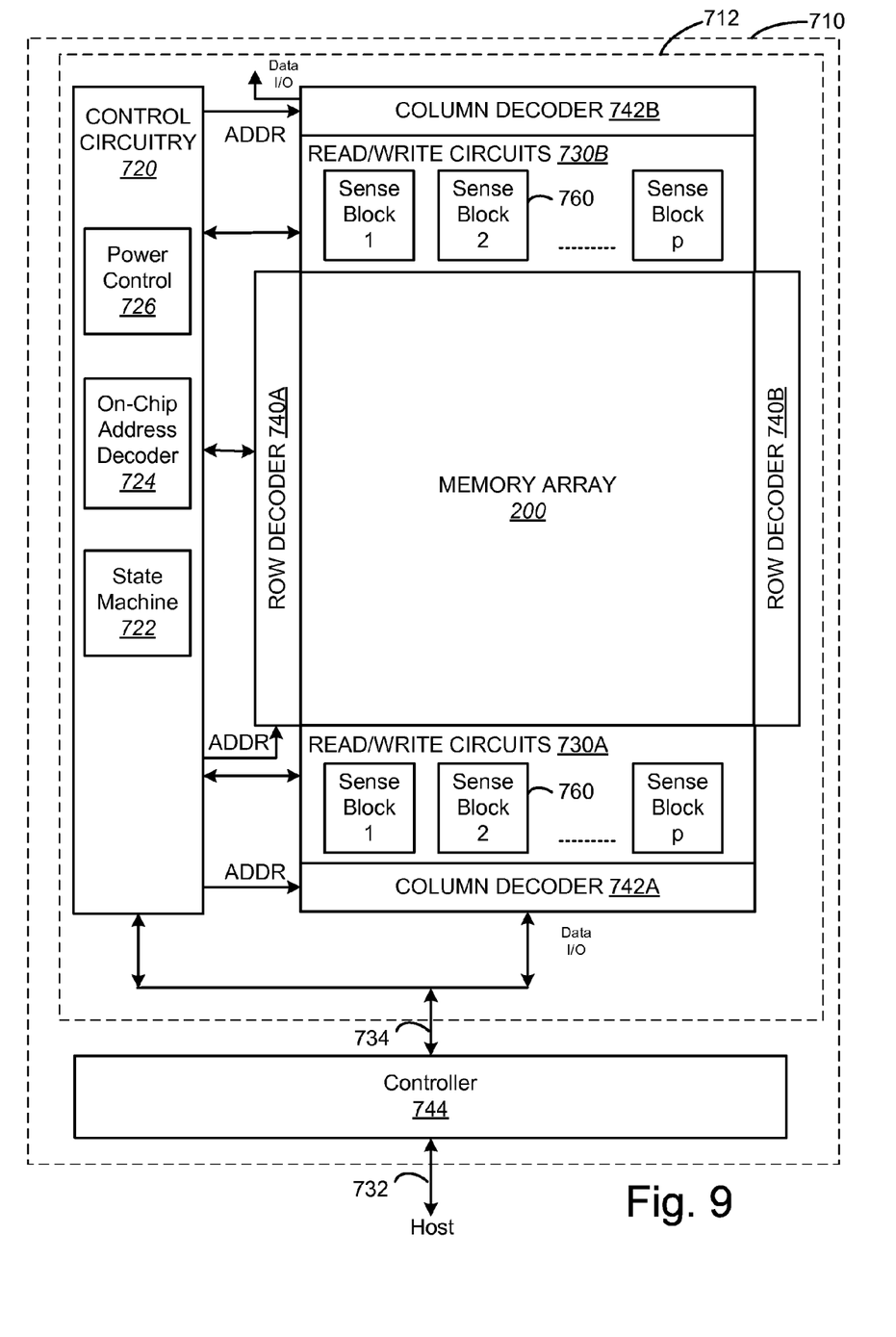
FIG. 9 is a block diagram of one embodiment of a non-volatile storage system.

FIG. 9 illustrates a non-volatile storage device 710 that may include one or more memory die or chips 712. Memory die 712 includes an array (two-dimensional or three dimensional) of memory cells 700 in accordance with the discussion above, control circuitry 720, and read/write circuits 730A and 730B. In one embodiment, access to the memory array 700 by the various peripheral circuits is implemented in a symmetric fashion, on opposite sides of the array, so that the densities of access lines and circuitry on each side are reduced by half. The read/write circuits 730A and 730B include multiple sense blocks 760 which allow a page of memory cells to be read or programmed in parallel. The memory array 700 is addressable by word lines via row decoders 740A and 740B and by bit lines via column decoders 742A and 742B. In a typical embodiment, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

Control circuitry 720 cooperates with the read/write circuits 730A and 730B to perform memory operations on the memory array 700. The control circuitry 720 includes a state machine 722, an on-chip address decoder 724 and a power control module 726. The state machine 722 provides chip-level control of memory operations. The on-chip address decoder 724 provides an address interface between that used by the host or a memory controller to the hardware address used by the decoders 740A, 740B, 742A, and 742B. The power control module 726 controls the power and voltages supplied to the word lines and bit lines during memory operations. In one embodiment, power control module 726 includes one or more charge pumps that can create voltages larger than the supply voltage.

In one embodiment, one or any combination of control circuitry 720, power control circuit 726, decoder circuit 724, state machine circuit 722, decoder circuit 742A, decoder circuit 742B, decoder circuit 740A, decoder circuit 740B, read/write circuits 730A, read/write circuits 730B, and/or controller 744 can be referred to as one or more managing circuits.

Figure 10:
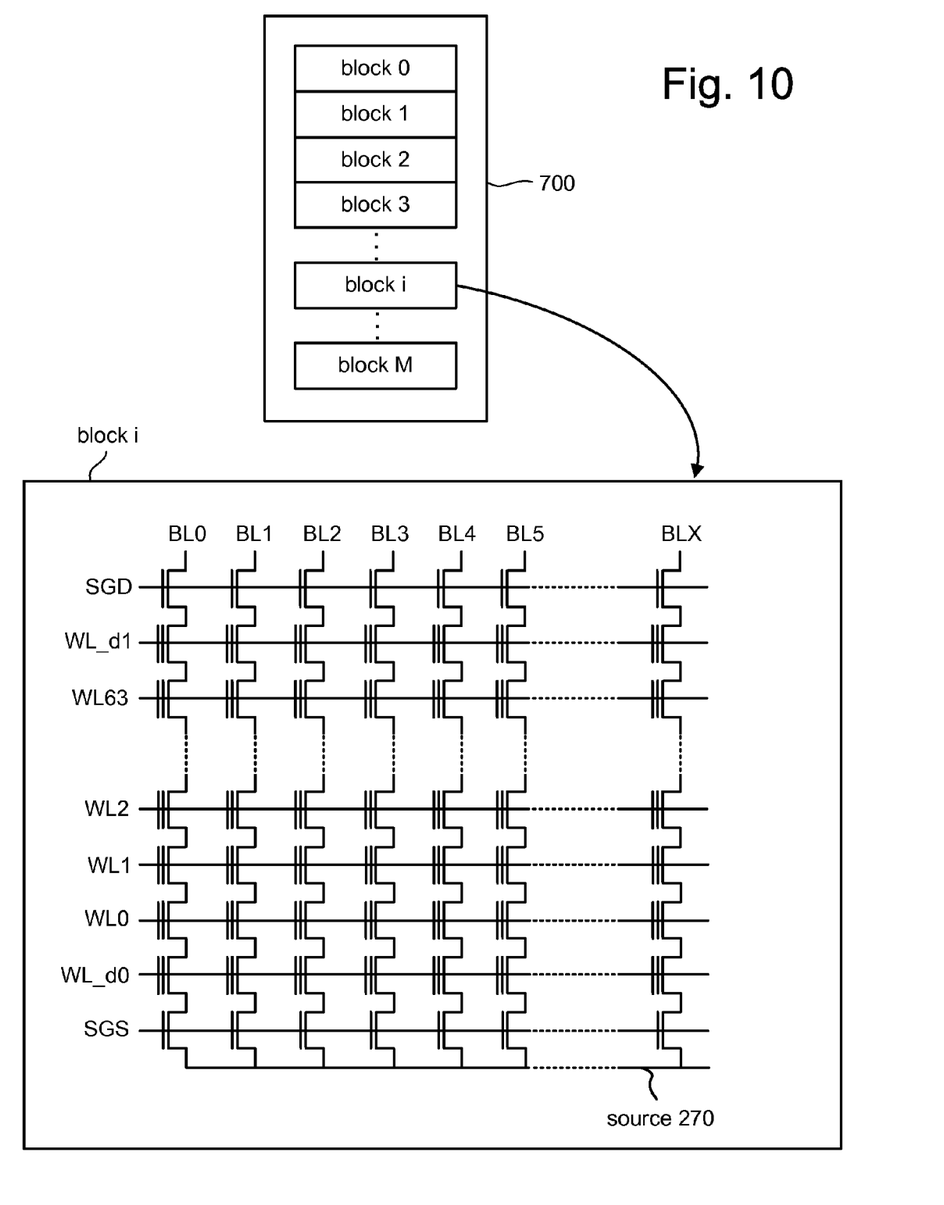
FIG. 10 is a block diagram of one embodiment of a memory array.

FIG. 10 depicts an exemplary structure of memory cell array 700. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

FIG. 10 shows more details of block i of memory array 700. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. FIG. 10 also shows source line 270 connected to the source line contact for all of the NAND strings of block i.

Erasing, programming and reading the memory cells discussed above is performed using the processes known in the art. For example, programming is performed by applying a set of programming pulses to the selected word line, with each pulse being a greater magnitude than the previous pulse by a constant step size (e.g., 0.1 v-0.4 v). Pulse magnitudes can range from 12-24 volts depending on the implementation. A set of unselected word lines can receive a boosting voltage (sometimes referred to as Vpass in the prior art) to boost unselected NAND strings according to a boosting scheme. There are many boosting schemes known in the art. NAND strings with a memory cell to be programmed have their bit line at 0 volts and NAND strings that are to be inhibited from programming have their bit line at VDD (2-3.5 volts). The p-well and the source will be at 0 volts, SGD will be at VDD, and SGS will be at 0 v. Between each pulse (or between a subset of the pulses) the system will verify whether the memory cell has reached its target. There are many variations of the programming process known in the art that are suitable for the structures described above. In one embodiment that the memory array has one or more dummy word lines, the REAB or RLSB boosting schemes are used. More information about the REAB and RLSB boosting schemes can be found in United States Patent Application Publication 2006/0279990.

In general, during verify operations and read operations, the selected word line is connected to a voltage level which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been sufficiently discharged or not. Note that the technology described herein can be used with different methods known in the art for verifying/reading.

When attempting to perform a read or verify operation to sense whether memory cells have a threshold voltage greater than some positive value, that positive value is applied to the selected word line and approximately 5 volts is applied to the unselected word lines. The p-well and the source will be at 0 volts. If the reading scheme includes discharging the corresponding bit line, then the bit line may be pre-charged to 0.7 volts.

When attempting to perform a read or verify operation to sense whether memory cells have a threshold voltage greater than some negative value, for example, negative one volt, then zero volts is applied to the selected word line and approximately five volts is applied to the unselected word lines. The p-well and the source will be at one volt. If the reading scheme includes discharging the corresponding bit line, then the bit line may be pre-charged to 1.7 volts.

Memory cells are erased in one embodiment by raising the p-well to an erase voltage (e.g., ~20 volts) for a sufficient period of time and grounding the word lines of a selected block while the bit lines are floating. Due to capacitive coupling, the unselected word lines, bit lines, and select lines are also raised to a fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

During the erase process, verify operations can be performed to determine whether the memory cells have been properly erased. In one embodiment, the verify operations during an erase process includes performing the verify operation discussed above with all word lines at 0 volts, the p-well and source at 2 volts, and the bit line at 2.7 volts. This allows for the testing of whether the memory cells have a threshold voltage of negative two volts.

The above description demonstrates that when performing verify operations to test for negative threshold voltages, the p-well will alternative between 0 volts for the programming pulse and a larger value for the verify operation. Because the p-well is connected to the source, the p-well voltage will stabilize quicker after a change. This increase in speed for the p-well voltage to stabilize will increase the speed of the programming process.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
   a first set of non-volatile storage elements on a well;
   a first bit line contact for said first set of non-volatile storage elements;
   a first source line contact for said first set of non-volatile storage elements;
   a first bit line that connects to said first bit line contact without connecting to said well; and
   a source line that connects to said first source line contact and connects to said well.

2. A non-volatile storage apparatus according to claim 1, wherein:
   said first bit line connects to said first bit line contact without extending into said well.

3. A non-volatile storage apparatus according to claim 1, wherein:
   said first bit line connects to and terminates at said first bit line contact.

4. A non-volatile storage apparatus according to claim 1, wherein:
   said source line connects to said first source line contact, passes through said first source line contact and protrudes into said well.

5. A non-volatile storage apparatus according to claim 1, wherein:
   said first set of non-volatile storage elements are connected;
   said first bit line contact is in said well; and
   said first source line contact is in said well.

6. A non-volatile storage apparatus according to claim 5, wherein:
   said first bit line connects to said first bit line contact without extending into said well.

7. A non-volatile storage apparatus according to claim 5, wherein:
   said first bit line connects to and terminates at said first bit line contact.

8. A non-volatile storage apparatus according to claim 5, wherein:
   said source line connects to said first source line contact, extends into said source line contact and extends into said well.

9. A non-volatile storage apparatus according to claim 5, wherein:
   said source line connects to said first source line contact, passes through said source line contact and protrudes into said well.

10. A non-volatile storage apparatus according to claim 5, further comprising:
    a second set of non-volatile storage elements that are connected;
    a second bit line contact for said second set of non-volatile storage elements, said second bit line contact is positioned in said well;
    a second bit line connected to said second bit line contact without connecting to said well; and
    a second source line contact for said second set of non-volatile storage elements, said second source line contact is positioned in said well, said source line extends into said first source line contact and said second source line contact.

11. A non-volatile storage apparatus according to claim 1, wherein:
    said first set of non-volatile storage elements comprise a first NAND string;
    said well is biased by said source line which is driven by a source line driver.

12. A non-volatile storage apparatus, comprising:
    a set of connected non-volatile storage elements on a well;
    a bit line contact for said set of non-volatile storage elements, said bit line contact is positioned in said well;
    a source line contact for said set of non-volatile storage elements, said source line contact is positioned in said well;
    a bit line that connects to said bit line contact without protruding into said well; and
    a source line that extends into said source line contact and extends into said well.

13. A non-volatile storage apparatus according to claim 12, wherein:
    said set of connected non-volatile storage elements comprise a NAND string.

14. A non-volatile storage apparatus according to claim 12, wherein:
    said well is a p-well;
    said p-well is positioned in an n-well; and
    said n-well is positioned in a p-substrate.

15. A non-volatile storage apparatus according to claim 12, wherein:
    said well is a p-well;
    said bit line contact is a n+ diffusion region; and
    said source line contact is a n+ diffusion region.

16. A non-volatile storage apparatus according to claim 12, wherein:
said bit line and said source line comprise metal; and
data is read said non-volatile storage elements by applying a positive voltage to said source line in order to read negative threshold voltages.

17. A non-volatile storage apparatus, comprising:
a set of non-volatile storage elements on a well;
a bit line contact for said set of non-volatile storage elements, said bit line contact is positioned in said well;
a source line contact for said set of non-volatile storage elements, said source line contact is positioned in said well;
a bit line that connects to said bit line contact and terminates at said bit line contact; and
a source line that connects to said source line contact, passes through said source line contact and protrudes into said well.

18. A non-volatile storage apparatus according to claim 17, wherein:
said set of non-volatile storage elements comprise a NAND string.

19. A non-volatile storage apparatus comprising:
a plurality of NAND strings on a well, said NAND strings include bit line contacts;
a plurality of bit lines that connect to said bit line contacts and do not connect to said well; and
a source line that connects to all of said plurality of NAND strings and said well.

20. A non-volatile storage apparatus according to claim 19, wherein:
said bit line contacts are positioned in said well;
said NAND strings include source line contacts in said well; and
said source line extends into said source line contacts and extends into said well.

21. A non-volatile storage apparatus according to claim 19, wherein:
said bit line contacts are positioned in said well;
said NAND strings include source line contacts in said well; and
said source line passes through said source line contacts and protrudes into said well.

* * * * *